United States Patent
Miyaji et al.

(10) Patent No.: US 7,501,727 B2
(45) Date of Patent: Mar. 10, 2009

(54) ALTERNATOR VOLTAGE CONTROL APPARATUS

(75) Inventors: Wakaki Miyaji, Tokyo (JP); Akinori Nishizawa, Tokyo (JP); Kyoko Higashino, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 353 days.

(21) Appl. No.: 10/564,164

(22) PCT Filed: Aug. 26, 2004

(86) PCT No.: PCT/JP2004/012265

§ 371 (c)(1),
(2), (4) Date: Jan. 11, 2006

(87) PCT Pub. No.: WO2006/022005

PCT Pub. Date: Mar. 2, 2006

(65) Prior Publication Data

US 2008/0042526 A1 Feb. 21, 2008

(51) Int. Cl.
*H02K 11/04* (2006.01)
(52) U.S. Cl. .................. 310/68 D; 310/51; 310/64; 310/68 R

(58) Field of Classification Search ............ 310/64, 310/68 D, 51, 68 R; 363/123, 125, 126, 144, 363/145
See application file for complete search history.

(56) References Cited

U.S. PATENT DOCUMENTS

| | | | | |
|---|---|---|---|---|
| 3,922,592 A | * | 11/1975 | Quantz | 320/123 |
| 4,146,831 A | * | 3/1979 | Farr | 322/94 |
| 4,489,374 A | * | 12/1984 | Yoshida | 363/145 |
| 6,754,946 B2 | * | 6/2004 | Nguyen | 29/596 |

FOREIGN PATENT DOCUMENTS

JP 2002-58172 A 2/2002

* cited by examiner

*Primary Examiner*—Tran N Nguyen
(74) *Attorney, Agent, or Firm*—Sughrue Mion, PLLC

(57) ABSTRACT

An alternator includes: a rotor fixed to a shaft so as to rotate with the shaft; a stator disposed so as to surround the rotor, an alternating current being generated in the stator by a rotating magnetic field from the rotor; and a voltage control apparatus for adjusting magnitude of an output voltage of the alternating current generated in the stator, wherein: the voltage control apparatus includes: a grounded, electrically-conductive heat sink; and a control main body fixed to the heat sink, the control main body including an integrated circuit chip on which a circuit for controlling the output voltage is formed. As a result, parts are reduced in number, reducing manufacturing costs.

5 Claims, 6 Drawing Sheets

ALTERNATOR VOLTAGE CONTROL APPARATUS

TECHNICAL FIELD

The present invention relates to an automotive alternator voltage control apparatus for performing control of output voltage in an automotive alternator mounted to a vehicle, for example.

BACKGROUND ART

Examples of conventional automotive alternator voltage control apparatuses are known that include: an integrated circuit (IC) chip on which a circuit for controlling alternator output voltage is formed; a first metal plate to which the IC chip is bonded; external connection terminals used for connection with an external circuit; and a second metal plate formed integrally with negative-side wiring for supplying power to the IC chip, the second metal plate having a position and size covering the IC chip on the first metal plate (See Patent Literature 1, for example).

In such configurations, the first metal plate functions as a radiating plate, and the second metal plate functions as power supply negative-side wiring and also functions to stop electromagnetic noise from penetrating through to the facing IC chip.

Patent Literature 1

Japanese Patent Laid-Open No. 2002-58172 (Gazette: [0013]-[0022]; FIG. 2.)

In conventional automotive alternator voltage control apparatuses, one problem has been that the second metal plate for stopping electromagnetic noise penetration must be disposed separately from the radiating first metal plate, making the number of parts large and increasing manufacturing costs.

Since the second metal plate is a component member of a terminal assembly that is insert molded together with other terminals such as positive-side terminals, the connector engaging control terminals, etc., another problem has been that if shape, layout, dimensions, etc., around the IC chip are changed, for example, a new terminal assembly must be manufactured accordingly.

Another problem has been that attention must also be paid to a distance separating the IC chip and the second metal plate while performing positioning between a IC chip portion to which the first metal plate is bonded and a terminal assembly portion, requiring a complicated procedure.

In addition, since the second metal plate also constitutes power supply negative-side wiring, there has also been doubt as to whether suppression of electromagnetic noise resulting from the presence of electric current can in fact be performed in wiring through which electric current flows at predetermined times.

DISCLOSURE OF INVENTION

The present invention aims to solve the above problems and an object of the present invention is to provide an alternator voltage control apparatus in which parts are reduced in number, reducing manufacturing costs, etc.

In order to achieve the above object, according to one aspect of the present invention, there is provided an alternator including: a rotor fixed to a shaft so as to rotate with the shaft; a stator disposed so as to surround the rotor, an alternating current being generated in the stator by a rotating magnetic field from the rotor; and a voltage control apparatus for adjusting magnitude of an output voltage of the alternating current generated in the stator, wherein: the voltage control apparatus includes: a grounded, electrically-conductive heat sink; and a control main body fixed to the heat sink, the control main body including an integrated circuit chip on which a circuit for controlling the output voltage is formed.

In an alternator voltage control apparatus according to the present invention, parts are reduced in number, reducing manufacturing costs.

BEST MODE FOR CARRYING OUT THE INVENTION

Figure 1:
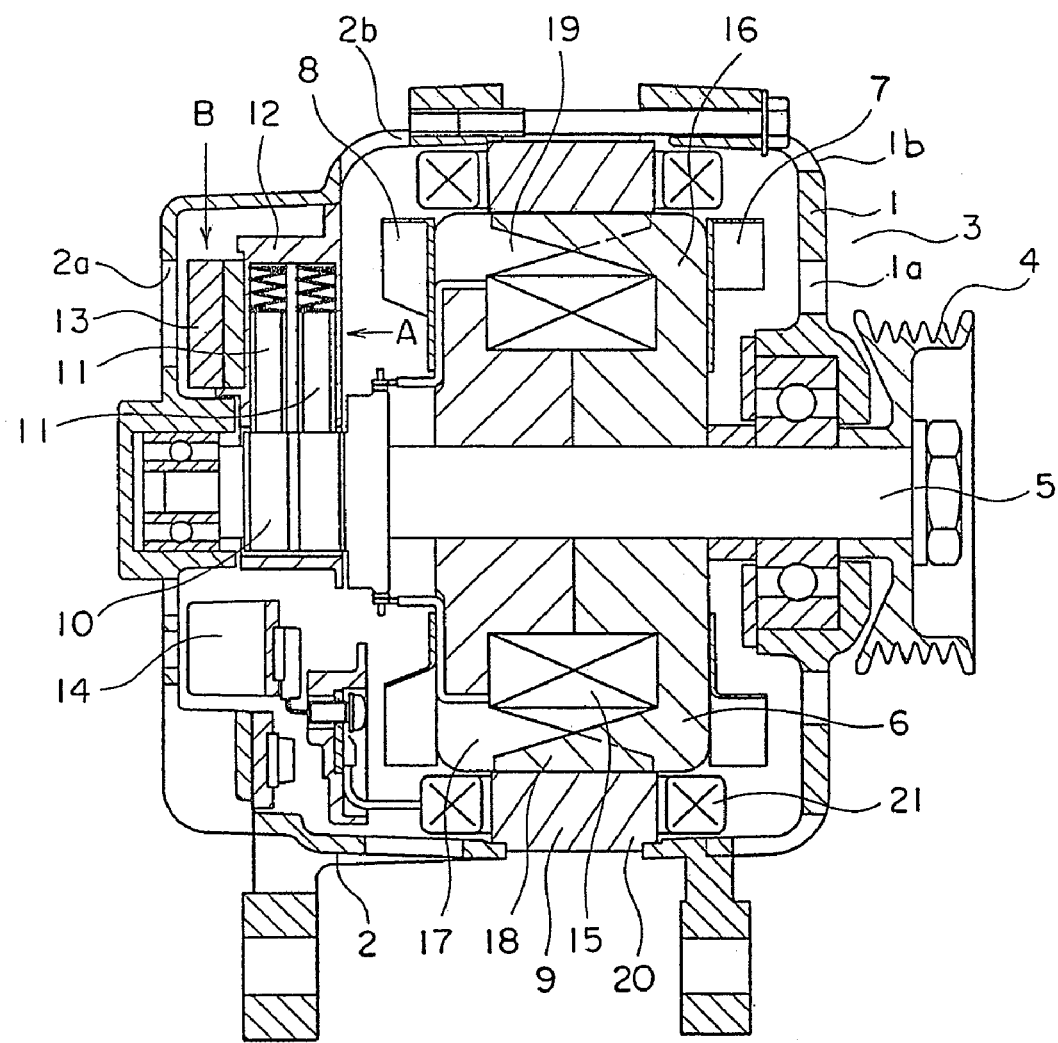
FIG. 1 is a cross section of an automotive alternator including a voltage control apparatus according to Embodiment 1 of the present invention.

Preferred embodiments of the present invention will now be explained based on drawings, and identical or corresponding members and portions in the drawings will be given identical numbering.

Embodiment 1

FIG. 1 is a cross section of an automotive alternator according to Embodiment 1 of the present invention.

In an automotive alternator constituting a dynamoelectric machine, a shaft 5 having a pulley 4 fixed to a first end portion is rotatably disposed inside a case 3 constituted by a front bracket 1 and a rear bracket 2 made of aluminum. A Lundell rotor 6 is fixed to the shaft 5. A front-end fan 7 is fixed to an end surface of the rotor 6 near the pulley 4, and a rear-end fan 8 is fixed to an end surface away from the pulley 4. A stator 9 is fixed to an inner wall surface of the case 3 around the rotor 6 so as to surround the rotor 6.

Slip rings 10 for supplying electric current to the rotor 6 are fixed to a second end portion of the shaft 5. A pair of brushes 11 housed inside a brush holder 12 slide in contact with surfaces of the slip rings 10.

A voltage control apparatus 13 for adjusting magnitude of alternating voltage generated in the stator 9 is fixed to the brush holder 12. A rectifier 14 electrically connected to the stator 9 so as to convert alternating current into direct current is also disposed inside the rear bracket 2.

A plurality of suction apertures 1a are formed on a radially-inner side of the front bracket 1 and a plurality of discharge apertures 1b are formed on a radially-outer side. A plurality of suction apertures 2a are formed on a radially-inner side of the rear bracket 2, and a plurality of discharge apertures 2b are formed on a radially-outer side.

The above rotor 6 includes: a rotor coil 15 for generating magnetic flux on passage of electric current; and a pole core disposed so as to cover the rotor coil 15. The pole core includes a front-end pole core body 16 and a rear-end pole core body 17 magnetized into North-seeking (N.) poles and South-seeking (S.) poles by the magnetic flux. The front-end pole core body 16 and the rear-end pole core body 17 have front-end claw-shaped magnetic poles 18 and rear-end claw-shaped magnetic poles 19, respectively, that are claw-shaped and intermesh with each other.

The stator 9 includes: a stator core 20 through which a rotating magnetic field from the rotor 6 passes; and a stator coil 21 disposed radially inside the stator core 20. A plurality of slots formed so as to extend axially are disposed at a uniform pitch around an entire circumference radially inside the stator core 20, which is configured by stacking steel sheets.

Figure 2:
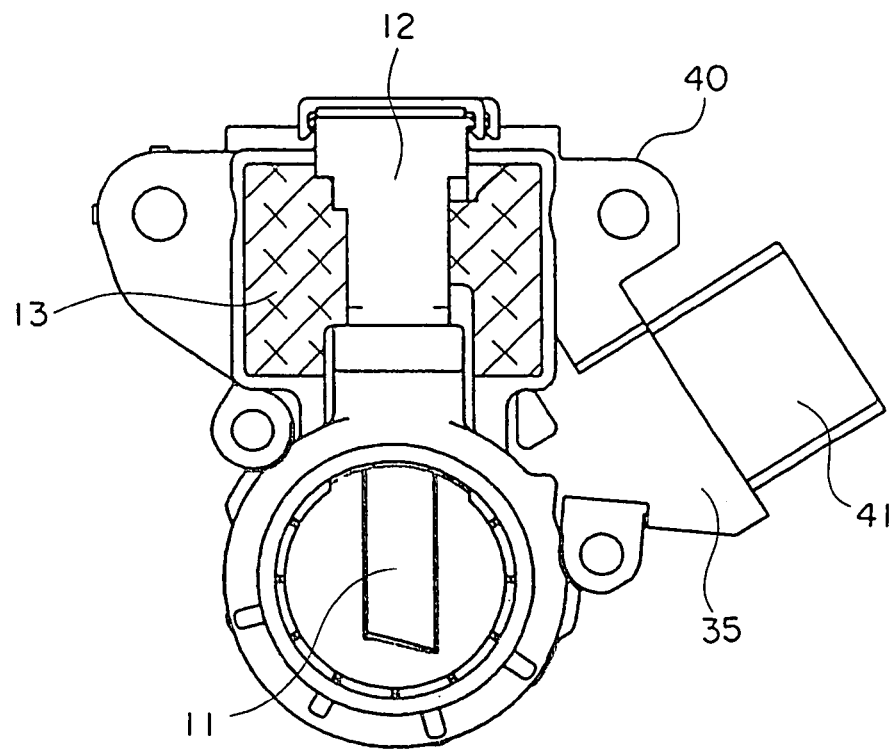
FIG. 2 is a view of the voltage control apparatus in the direction of arrow A in FIG. 1.
Figure 3:
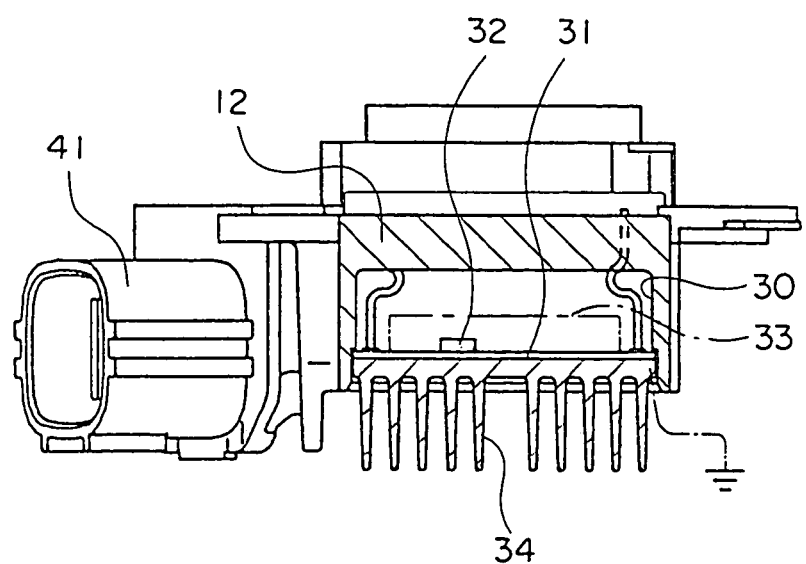
FIG. 3 is a partial cross section of the voltage control apparatus when viewed from a rear bracket end in the direction of arrow B in FIG. 1.

FIG. 2 is a view of an internal portion of the alternator in the direction of arrow A in FIG. 1, and FIG. 3 is a view of the alternator when viewed from a rear bracket end in the direction of arrow B in FIG. 1 (with the voltage control apparatus 13 in cross section).

The brush holder 12 and a connector 41 are integrated with a base 40 in which insert conductors are embedded internally by insertion molding using a polyphenylene sulfide (PPS) resin.

The voltage control apparatus 13 is housed in a recessed housing portion 30 formed on the brush holder 12. The voltage control apparatus 13 includes: a circuit board 31; a circuit portion 33 in which an integrated circuit (IC) chip 32, on which a circuit for controlling the alternator, etc. is formed, is mounted to the circuit board 31; and an aluminum heat sink 34 fixed to the circuit board 31 and grounded. Here, a control main body is constituted by the circuit board 31 and the circuit portion 33, in which the IC chip 32 is mounted to the circuit board 31.

The heat sink 34 is grounded by being electrically connected to the case 3, which constitutes a grounding member, by means of a current-carrying part. Moreover, the heat sink may also be electrically connected to the case directly.

In an automotive alternator having the above configuration, electric current is supplied from a battery (not shown) through the brushes 11 and the slip rings 10 to the rotor coil 15, generating a magnetic flux and giving rise to North-seeking (N.) poles and South-seeking (S.) poles in the front-end and rear-end claw-shaped magnetic poles 18 and 19, respectively.

At the same time, since the pulley 4 is driven by an engine and the rotor 6 is rotated by the shaft 5, a rotating magnetic field is applied to the stator core 20, giving rise to electromotive force in the stator coil 21.

Magnitude of the alternating-current electromotive force is adjusted by the voltage control apparatus 13, and the alternating-current electromotive force also passes through the rectifier 14 and is converted into direct current, and the battery is charged.

In an automotive alternator voltage control apparatus 13 according to this embodiment, because the control main body including the IC chip 32 is fixed to the grounded heat sink 34, electromagnetic noise potentially penetrating through the heat sink 34 to the IC chip 32 is blocked by the heat sink 34, enabling problems, such as induced voltages arising in the circuitry inside the IC chip 32 due to electromagnetic noise, to be prevented.

The heat sink 34 for radiating heat generated in the control main body also serves to block electromagnetic noise, eliminating a necessity to dispose a special member expressly to handle electromagnetic noise, thereby reducing manufacturing costs and also improving assembly.

Because the heat sink 34 is electrically connected by means of a current-carrying part to the case 3, which constitutes a grounding member, electric potential of the heat sink 34 is equal to that of ground, reducing electric potential vibrations in electric potential reference planes of internal portions of the IC chip 32 and the vicinity thereof, enabling electromagnetic noise disruptions to be further reduced.

Moreover, in the above embodiment, the control main body has been explained as being constituted by a circuit board 31 and a circuit portion 33 in which the IC chip 32, etc., is mounted to the circuit board 31, but the control main body may also be of a molded package type in which the IC chip, etc., is enveloped in a resin.

Embodiment 2

Figure 4:
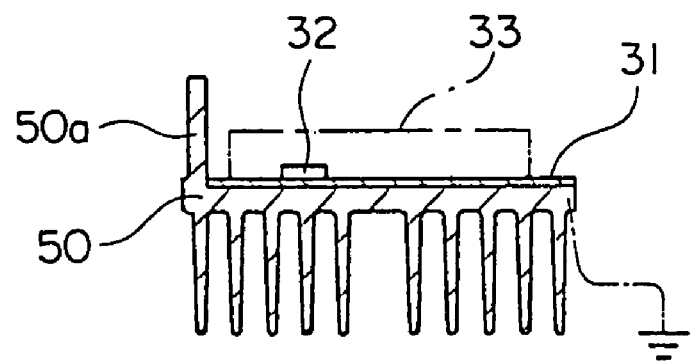
FIG. 4 is a partial cross section showing an automotive alternator voltage control apparatus according to Embodiment 2 of the present invention.

FIG. 4 is a partial cross section showing an automotive alternator voltage control apparatus according to Embodiment 2 of the present invention.

In this embodiment, a positioning portion 50a extending perpendicular to a major surface of a heat sink 50 to which an IC chip 32 is mounted is disposed on a major surface end portion of the major surface.

The rest of the configuration is similar to that of Embodiment 1.

In the voltage control apparatus 13 according to this embodiment, area of the heat sink 50 covering the control main body is increased compared to that of Embodiment 1 by disposing the positioning portion 50a, enabling performance in preventing electromagnetic noise from penetrating to the IC chip 32 to be further improved.

The positioning portion 50a enables relative positioning of the control main body on the heat sink 50 to be achieved by placing a leading end surface of the control main body in contact with the positioning portion 50a as the control main body is being mounted to the heat sink 50, improving assembly.

Figure 5:
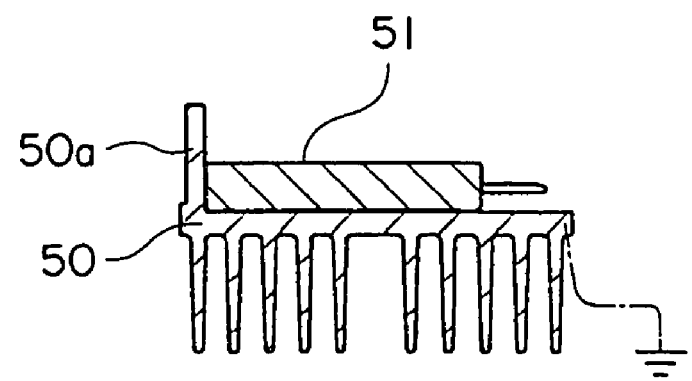
FIG. 5 is a partial cross section showing another example of automotive alternator voltage control apparatus according to Embodiment 2 of the present invention.

Moreover, as shown in FIG. 5, a molded package 51 constituting a control main body in which an IC chip is enveloped in a resin may also be bonded to the heat sink 50.

Embodiment 3

Figure 6:
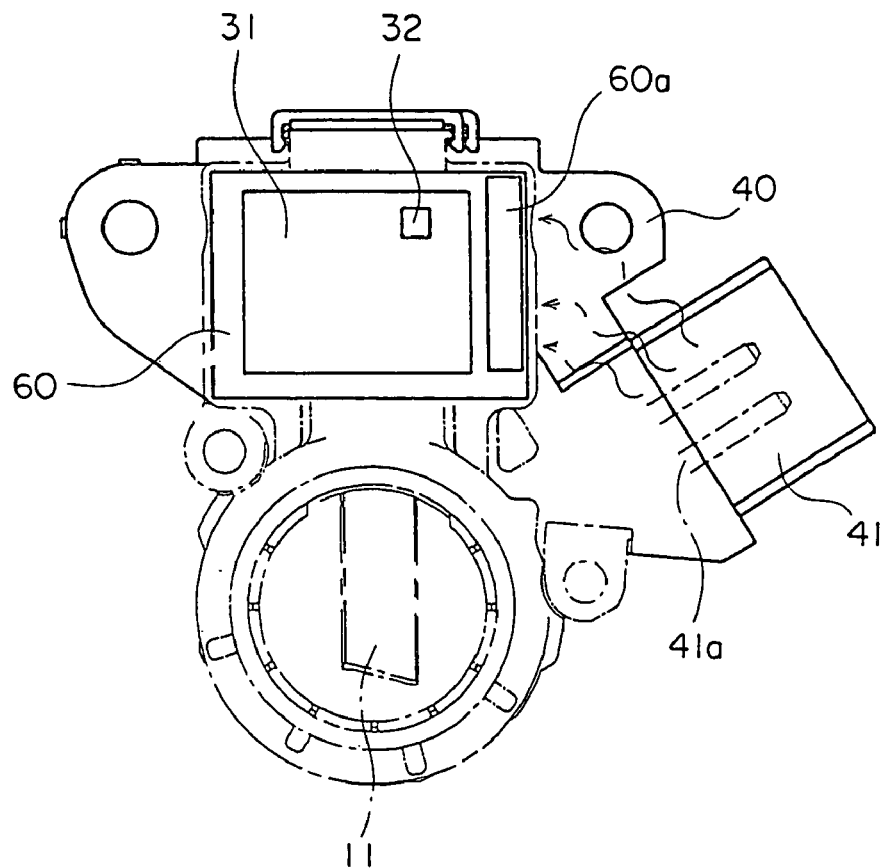
FIG. 6 is a front elevation showing an automotive alternator voltage control apparatus according to Embodiment 3 of the present invention.

FIG. 6 is a front elevation showing an automotive alternator voltage control apparatus according to Embodiment 3 of the present invention.

In this embodiment, a blocking portion 60a extending perpendicular to a major surface of an aluminum heat sink 60 is disposed on the heat sink 60 between a connector 41 having terminals 41a for sensing a battery voltage, etc., and an IC chip 32.

In an automotive alternator voltage control apparatus 13 according to this embodiment, electromagnetic noise potentially penetrating from the connector 41 to the IC chip 32 is blocked by the blocking portion 60a.

Moreover, in a similar manner to each of the above embodiments, this embodiment can also be applied to a control main body of a molded package type in which an IC chip is enveloped in a resin.

Embodiment 4

Figure 7:
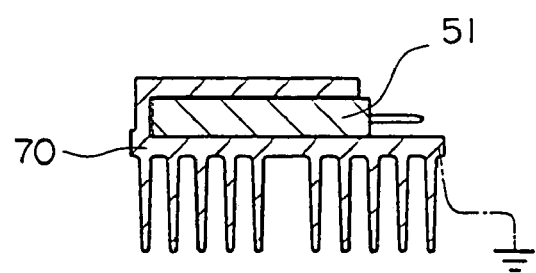
FIG. 7 is a partial cross section showing an automotive alternator voltage control apparatus according to Embodiment 4 of the present invention.
Figure 8:
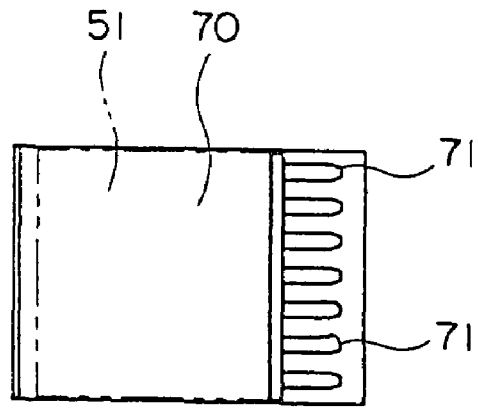
FIG. 8 is a plan of FIG. 7.
Figure 9:
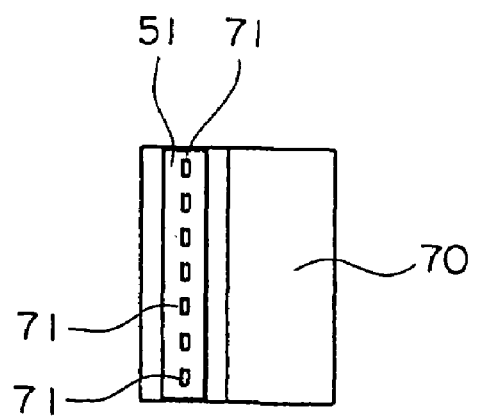
FIG. 9 is a right side elevation of FIG. 7.

FIG. 7 is a partial cross section showing an automotive alternator voltage control apparatus according to Embodiment 4 of the present invention, FIG. 8 is a plan of FIG. 7, and FIG. 9 is a right side elevation of FIG. 7.

In this embodiment, a heat sink 70 covers three surfaces of a rectangular hexahedral molded package 51 constituting a control main body, excluding a surface from which connecting terminals 71 project.

The aluminum heat sink 70 has a generally angular C-shaped cross section, and the molded package 51 is held by elastic force from the heat sink 70.

Figure 10:
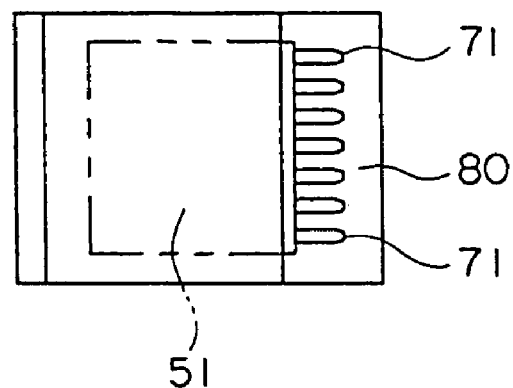
FIG. 10 is a partial plan showing another example of an automotive alternator voltage control apparatus according to Embodiment 4 of the present invention.
Figure 11:
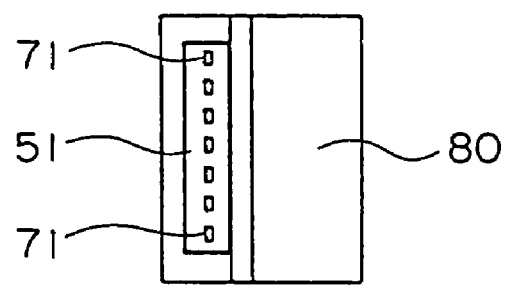
FIG. 11 is a right side elevation of FIG. 10.

Moreover, as shown in FIGS. 10 and 11, the six surfaces of the molded package 51 except for the surface from which the connecting terminals 71 project may also be generally covered by an aluminum heat sink 80.

In the voltage control apparatus 13 according to this embodiment, area of the heat sink 70 or 80 covering the molded package 51 is increased, enabling performance in preventing electromagnetic noise from penetrating to the IC chip 32 to be further improved.

Positioning of the molded package 51 relative to the heat sink 70 or 80 is performed by inserting the molded package 51 through an opening portion of the heat sink 70 or 80 with the connecting terminals 71 facing outward until the molded package 51 is placed in contact with a bottom surface, and the heat sink 70 or 80 and the molded package 51 are integrated.

Consequently, assembly is improved, and a necessity to dispose apertures, etc., on the molded package 51 as a mechanism for fixing the molded package 51 to the heat sink 70 and 80 is eliminated, increasing the degree of product freedom for the molded package 51.

Furthermore, because a large portion of the molded package 51 is placed in close contact with the heat sink 70 or 80, heat from the molded package 51 is radiated highly efficiently, also improving cooling.

Moreover, in each of the above embodiments, explanations have been given for automotive alternators, but the present invention can of course also be applied to other alternating-current generators driven to rotate using an internal combustion engine other than a vehicle-mounted engine, or an electric motor, a water wheel, etc., as a driving source.

The heat sinks 34, 50, 60, 70, are 80 are described as being made of aluminum, but of course they are not limited to this material, and may also be made of copper, for example.

The invention claimed is:

1. An alternator comprising:
a rotor fixed to a shaft so as to rotate with said shaft;
a stator disposed so as to surround said rotor, an alternating current being generated in said stator by a rotating magnetic field from said rotor; and
a voltage control apparatus for adjusting magnitude of an output voltage of said alternating current generated in said stator,
wherein:
said voltage control apparatus comprises
a grounded, electrically-conductive heat sink; and
a control main body fixed to said heat sink, said control main body including an integrated circuit chip on which a circuit for controlling said output voltage is formed,
said grounded heat sink being positioned to block electromagnetic noise from penetrating through said heat sink to said integrated circuit chip.

2. The alternator according to claim 1, wherein
a positioning portion for positioning said control main body relative to said heat sink is disposed on said heat sink so as to project from a major surface of said heat sink to which said control main body is fixed.

3. The alternator according to claim 1, wherein:
a blocking portion is disposed on said heat sink between a connector having terminals for electrical connection to an external portion and said integrated circuit chip, said blocking portion blocking electromagnetic noise from said connector.

4. The alternator according to claim 1, wherein:
said control main body is a molded package in which said integrated circuit chip is enveloped in a resin.

5. The alternator according to claim 4, wherein:
said heat sink has a substantially angular C-shaped cross section and is placed in close contact with at least three surfaces of said molded package excluding a surface from which connecting terminals project.

* * * * *